United States Patent [19]

Breithaupt

[11] Patent Number: 4,612,578
[45] Date of Patent: Sep. 16, 1986

[54] IMAGER SYSTEM FOR NON-DESTRUCTIVE PROFILE READ-OUT

[75] Inventor: David Breithaupt, DeWitt, N.Y.

[73] Assignee: General Electric Co., Charlottesville, Va.

[21] Appl. No.: 720,650

[22] Filed: Apr. 4, 1985

[51] Int. Cl.⁴ ............................................. H04N 3/14
[52] U.S. Cl. ..................................... 358/212; 358/209
[58] Field of Search .................. 358/213, 212, 209, 44, 358/48; 357/24 LR, 30; 250/578, 211 J

[56] References Cited

U.S. PATENT DOCUMENTS

| | | | |
|---|---|---|---|
| 3,988,613 | 10/1976 | Brown et al. | 250/211 J |
| 4,000,418 | 12/1976 | Waldron et al. | 357/24 |
| 4,240,116 | 12/1980 | Tomlinson, Jr. | 358/213 |
| 4,241,421 | 12/1980 | Burke et al. | 358/183 |
| 4,251,834 | 2/1981 | Hall | 358/213 |
| 4,369,468 | 1/1983 | Hall | 358/213 |

Primary Examiner—Gene Z. Rubinson
Assistant Examiner—Robert G. Lev
Attorney, Agent, or Firm—Irving M. Freedman

[57] ABSTRACT

A method and apparatus for obtaining a profile read-out of an object in a field of view of a solid-state imager without destruction of the image data at the imager. In an application using a CID imager, X-axis and Y-axis projections of the array are obtained by sensing charge transfer from sequentially addressed columns into all rows simultaneously followed by sensing charge transfer from sequentially addressed rows into all columns simultaneously. Calculation of centroid and area of an image can be obtained without the necessity of reading out each pixel.

7 Claims, 6 Drawing Figures

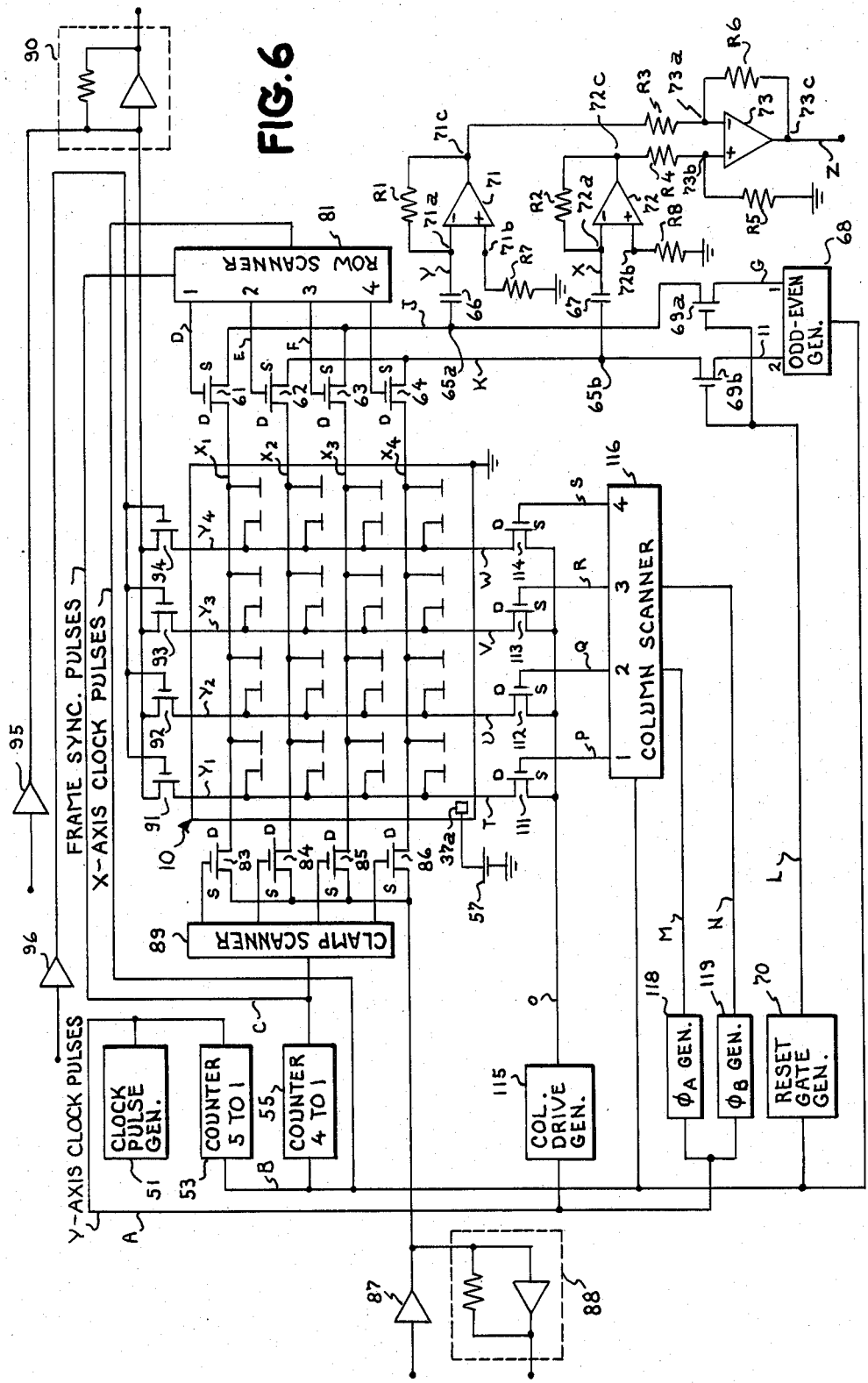

IMAGER SYSTEM FOR NON-DESTRUCTIVE PROFILE READ-OUT

BACKGROUND OF THE INVENTION

The present invention relates to solid state imaging systems and, more particularly, to a method for rapidly identifying and measuring objects whose image is sensed by the imaging system.

This application relates to improvements in the method of operation of imaging systems of the type disclosed in U.S. Pat. Nos. 4,240,116 and 4,241,421 both of which are signed as to the assignee of the present invention. Those patents disclose a solid state imaging apparatus of the type commonly referred as a charge injection device (CID) and describe certain electronic processing apparatus for obtaining from the CID imager digital information of the type which can be processed to identify, measure and recognize objects and alpha-numeric characters. The method of operation of this apparatus disclosed in these prior art patents is to individually interrogate each of a plurality of picture elements (pixels) which are formed on a solid state substrate in order to build a picture of an object which has been imaged on the solid state imager. In order to provide an adequate picture of an object using this type of imager, the imager is normally formed of a matrix of solid state pixels which may have as many as 512 rows and 512 columns of pixels. Such a matrix results in excess of 250,000 individual pixels which must be individually interrogated in order to develop an image of an object which has been placed within a field of view of the imager.

Various methods of data processing have been utilized in order to reduce the time required to process data obtained from solid state imagers. One such method has been to use a technique commonly referred to as profile analysis. In profile analysis, the values associated with each pixel of a row are summed together to form a single value for each row of the matrix. Subsequently, the values associated with each pixel in each column are summed together to obtain a profile along the column axis. This type of profile analysis is useful in identifying objects and in providing measurements of the boundaries and/or centroids of objects imaged on the imager. However, in the prior art systems it has been necessary to read each individual pixel into a memory which is part of a data processing system and to subsequently operate on the data stored in the memory to generate the profiles of the objects along the X and Y axis of the imager. Accordingly, it will be appreciated that it is still necessary to read out each individual pixel from the matrix before the profile data can be generated although this technique will reduce the comparison time which is required if the status of each individual pixel is separtely evaluated against stored memory characteristics of an object to be identified.

It is an object of the present invention to provide an improved method of operating a solid state imager which will permit high speed object recognition and identification.

In carrying out the invention in the context of the apparatus disclosed in the aforementioned patents, there is provided a method for reading directly from the solid state imager the values associated with the pixels in each row and in each column of the matrix of pixels without the necessity of having to store the individual pixel values in memory prior to generating the profile data. In particular, a method is provided for non-destructive reading of the pixel values such that each pixel can be summed once during the generation of the profile along the row axes and summed a second time during the generation of the profile along the column axes. The invention is preferably implemented in a CID type of imager which permits a charge transfer within each pixel element without destruction of the charge.

DESCRIPTION OF THE DRAWINGS

The novel features which are believed to be characteristic of the present invention are set forth with particularity in the appended claims. The invention itself, both as to its organization and method of operation, together with further objects and advantages thereof may best be understood by reference to the following description taken in conjunction with the accompanying drawings wherein:

FIG. 6 is a block diagram of an image sensing apparatus in accordance with the present invention.

Figure 1:
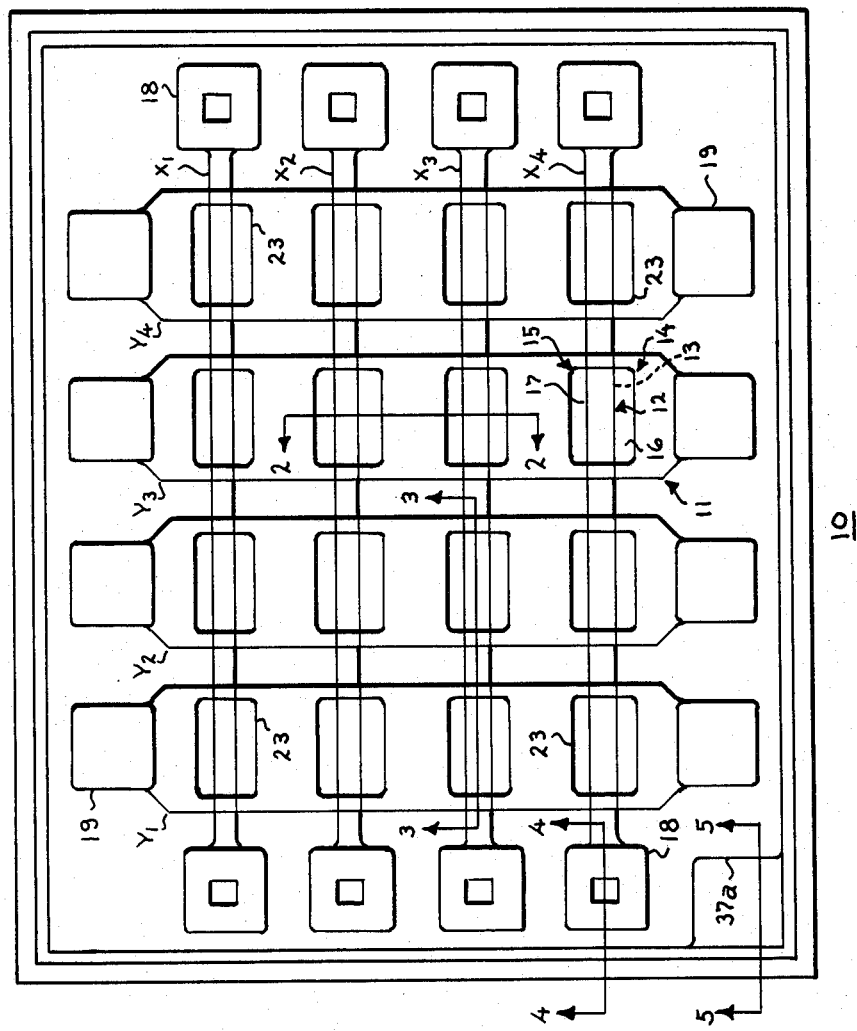
FIG. 1 is a plan view of an array or assembly of charge storage devices incorporated in the apparatus utilizing the method of the present invention.
Figure 2:
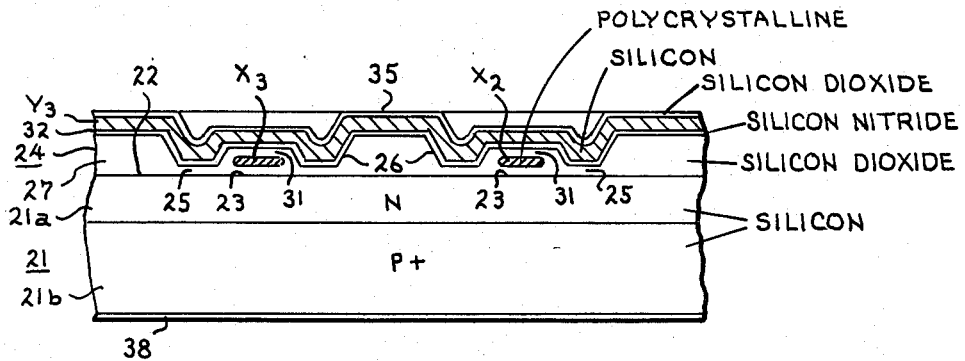
FIG. 2 is a sectional view of the assembly of FIG. 1 taken along section lines 2—2 of FIG. 1.
Figure 3:
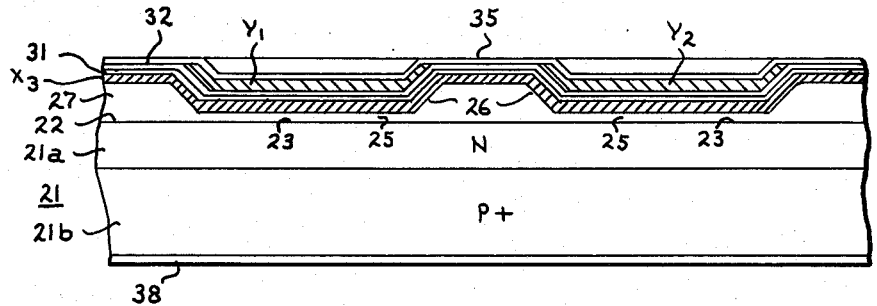
FIG. 3 is a sectional view of the assembly of FIG. 1 taken along section lines 3—3 of FIG. 1.

Before proceeding to describe the apparatus of FIG. 6 embodying the present invention, an array (10) of charge storage and radiation sensing devices used in the apparatus and shown in FIGS. 1-5 will be described. Such imaging sensing arrays are described in U.S. Pat. No. 3,988,613. The image sensing array (10) includes a plurality of radiation sensing devices (11) each of which includes a first or row CIS (Conductor-Insulator-Semiconductor) charge storage capacitor (12) of generally rectangular outline and a pair of column CIS charge storage capacitors (14) and (15), collectively designated as a second charge storage capacitor, also of generally rectangular outline, each adjacent a respective side of the row CIS charge storage capacitor, also of generally rectangular outline, each adjacent a respective side of the row CIS charge storage capacitor (12). The plate or conductor (13) of capacitor (12) is connected to and integral with a row conductor line of the row in which the device is located. The plates or conductors (16) and (17) of capacitors (14) and (15) are connected to and are integral with the column conductor line of the column in which the device is located. The radiation sensing devices 11 are arranged in four rows and four columns. The array includes four row conductor lines, each connecting the row plates of a respective row of devices, and are designated from top to bottom $(X_1)$, $(X_2)$, $(X_3)$ and $(X_4)$. The array also includes four column conductor lines orthogonally oriented with respect to the row conductor lines, each connecting the column plates of a respective column of devices, and are designated from left to right $(Y_1)$, $(Y_2)$, $(Y_3)$ and $(Y_4)$. The row lines are constituted of a light transmissive conductive material, such as doped polycrystalline silicon. Conductive connections are made to the row lines $(X_1)$–$(Y_4)$ through conductive landings or contacts (18) provided at both ends of each of the row lines. Conductive connections are made to the column lines (Y$_1$)–(Y$_4$) through conductive landings or contacts (19) provided at both ends of each of the column lines.

The array (in FIG. 2) includes a substrate or wafer of silicon semiconductor material having a high resistivity layer (21a) of N type conductivity epitaxially formed on a low resistivity base layer (21b) of P type conductivity. The layer (21a) has a major surface (22) in which are provided a plurality of rows and columns. The surface regions (23) are of substantially identical area and outline. As shown, the surface regions (23) are of generally rectangular outline with the long sides parallel to the row direction and the short sides parallel to the column direction. A thick layer (24) of light transmissive insulating material such as silicon dioxide overlies the major surface and has a plurality of thin portions (25) each in registry with respective one of the surface regions (23). The thin portions are provided by forming deep recesses (26) in the thick insulating layer. Thus, the insulating layer (24) includes thick or ridge portions (27) surrounding a plurality of thin portions (25) in the bottoms of the recesses (26). A plurality of row conductor lines (X$_1$)–(X$_4$) each of the same and uniform width are provided overlying the layer of insulation. Each row conductor line being in traversing relationship to the surface regions (23) of a respective row of surface regions and overlying fixed first portions of the surface region of the respective row. The portions of the row conductor lines overlying the surface regions (23) constitute the conductors of a plurality of first conductor-insulator-semiconductor capacitors formed with the insulating layer (25) and the substrate (21). A plurality of column conductor lines (Y$_1$)–(Y$_4$) each of the same and uniform width are provided insulatingly overlying the row conductor lines. Each column conductor line is in traversing relationship to the surface regions (23) of a respective column of surface regions and overlies entirely the surface regions of the respective column. The portions of the column conductor lines overlying the surface regions not shielded or masked by the row conductor lines constitute the split conductors (16) and (17) of a plurality of second conductor-insulator-semiconductor capacitors formed with the thin portions (25) of the insulating layer and substrate. Each second conductor-insulator-semiconductor capacitor includes a pair of capacitors (14) and (15) both of which are coupled to a respective first conductor-insulator-semiconductor capacitor (12).

A thin insulating layer (31) of silicon dioxide surrounds the row lines (X$_1$)–(X$_4$) of polycrystalline silicon. A thin layer of silicon nitride (32) is provided between the column lines (Y$_1$)–(Y$_4$) and the row lines (X$_1$)–(X$_4$). A thin layer of silicon dioxide (35) is formed over the upper face of the array including the column conductor lines (Y$_1$)–(Y$_4$).

Figure 4:
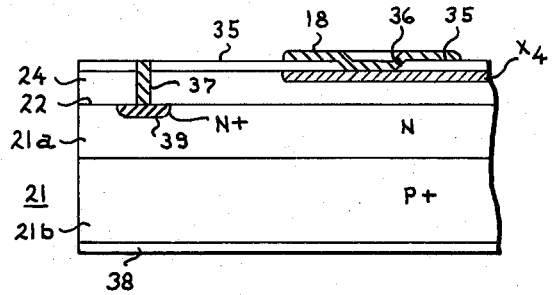
FIG. 4 is a sectional view of the assembly of FIG. 1 taken along section lines 4—4 of FIG. 1.
Figure 5:
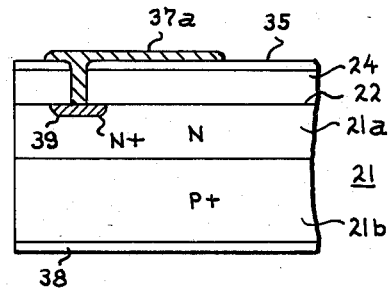
FIG. 5 is a sectional view of the assembly of FIG. 1 taken along section lines 5—5 of FIG. 1.

The contacts (18) to the polycrystalline silicon row lines are made through openings (36) in the protective layer (35) as shown in FIG. 4 and are filled with a conductor such as aluminum. The aluminum is sintered to provide good bonds to the polycrystalline silicon lines (X$_1$)–(X$_4$). The contact (19) of aluminum for the column lines are similarly made to the column lines (Y$_1$)–(Y$_4$). To provide conductive connection to the epitaxial layer (21a) an opening (37) is made in the silicon dioxide layers (24) and (35) in registry with an N+ surface adjacent region (39) around the periphery of the layer (21a) as shown in FIG. 5. The opening is filled with a conductor such as aluminum which is sintered to N+ region and terminated in contact (37a). A conductive electrode (38) of a suitable material such as aluminum is applied to the other major face of the substrate (21) to provide an ohmic connection thereto.

The array (10) and the device (21) of which they are comprised may be fabricated using a variety of materials and in a variety of sizes in accordance with established techniques for fabricating integrated circuits as described in the aforementioned U.S. Pat. No. 3,988,613 and in U.S. Pat. No. 3,993,897.

Referring now to FIG. 6 there is shown a block diagram of apparatus, utilizing the charge storage array of FIGS. 1–5, which provides a video signal in response to radiation imaged on the array by a lens system (not shown) for example. The method of normal operation of the apparatus of FIG. 6 is described in detail along with timing diagrams in the aforementioned U.S. Pat. Nos. 4,240,116 and 4,241,421, the disclosures of which are hereby incorporated by reference. However, before turning to the specifics of the present invention, the apparatus of FIG. 6 will be first described in conjunction with readout of each individual picture element.

The apparatus includes a clock pulse generator (51) which develops a series of regularly occurring Y-axis pulses of short duration occurring in sequence. The output of the clock pulse generator (51) is applied to a first counter (53) which divides the count of the clock-pulse generator by five to derive X-axis clock pulses. The output of the first counter (53) is also applied to a second counter (55) which further divides the count applied to it by four to provide frame synchronizing pulses to the array.

The sensing array (10), which is identical to the sensing array of FIGS. 1–5 and is identically designated, includes row conductor lines (X$_1$)–(X$_4$) and column conductor lines (Y$_1$)–(Y$_4$). The drive circuits for the row conductor lines (X$_1$)–(X$_4$) and for the column conductor lines (Y$_1$)–(Y$_4$) of array (10) are included on the same substrate (21) as the array to minimize the number of external connections which are required to be made for connection of the array (10) into the apparatus.

In the operation of the apparatus the epitaxial layer (21a) is biased by a source (57) at a small positive voltage, for example 2 volts, with respect to the P type layer (21b) so that charge injected into layer (21a) from a scanned row of devices is rapidly removed from this layer and recollection thereof avoided on reestablishment of storage voltages on the devices of that row. Such a structure enables the array to be operated at higher speeds as injected charge is rapidly removed from the epitaxial layer. Injection of stored charge in a device is accomplished by raising the row connected plate and the column connected plate thereof to zero volts for a short period of time. During injection of stored charge, as the plates of the device are at a small negative voltage with respect to the layer (21a), a bias charge is retained in the device. Operating the array with such bias charge eliminates noise which would be produced by the emptying and filling the surface states of the layer (21a) in operation.

To enable selective readout of a row of devices a plurality of row enable switches (61)–(64) are provided. The row-enable switches (61)–(64) are in the form of MOSFET transistor devices formed integrally on the substrate, each having a source electrode, a drain electrode and a gate electrode. Each of the drain electrodes of devices (61)–(64) is connected to one end of a respective one of the row conductor lines $(X_1)$–$(X_4)$. Each of the source electrodes of the devices (61) and (63) is connected to row bias terminal (65a). Each of the source electrodes of devices (61) and (62) is connected to a row bias terminal (65b). Each of the terminals (65a) and (65b) are connected to corresponding input terminals of a differential amplifier circuit (66) which is described in the aforementioned U.S. Pat. Nos. 4,240,116 and 4,241,421. Since the amplifier (66) is not required in the practice of the present invention, no additional description is given here.

The gate electrodes of the transistors (61)–(64) are connected to successive output terminals of the row shift register or row scanner (81) numbered respectively (1), (2), (3) and (4). The input to scanner (81), referred to as the frame sync pulse, is the pulse obtained at the output of the second counter (55). One frame sync pulse occurs for every twenty Y-axis clock pulses. Oppositely phased clock drive pulses for the row scanner (81) are derived from the X-axis clock pulses. The oppositely phased drive pulses are applied to each of the stages of the row scanner (81) to produce the desired outputs at the terminals (1)–(4) thereof. The row scanner (81) may be any of a number of shift registers known to the art. The elements of the scanner (81) may be formed on the substrate at the same time that the devices of the array (10) are formed.

During the occurrence of gating pulses on terminals (1) and (2) of the row scanner (81), transistors (61) and (62) are turned on, connecting row line $(X_1)$ to terminal (65a) and connecting row line $(X_2)$ to terminal (65b). Prior to the instant of time $(t_0)$, the devices of row $(X_1)$ have been read out and prior to time $(t_1)$ the charge stored in these devices has been simultaneously injected into the substrate.

Readout of the devices is accomplished by application of voltage to column lines $(Y_1)$–$(Y_4)$, respectively. By lowering the voltage applied to column line $(Y_1)$ to $-15$ volts, the first device in the first row $(X_2)$ is read out by the drop in potential of the $(Y_1)$ line to $-15$ volts which causes charge stored in the row cell to transfer into the column cell of the first device. The transferred charge is sensed on terminal (65b) connected to line $(X_2)$ through transistor (62). Simultaneously, any signal on line $(X_1)$ due to shift in voltage on the column electrode of the first device in the first row (which has been emptied of charge at the end of the previous row scan period) is sensed on terminal (65a). The differential amplifier (66) produces an output which is the difference of the two signals. The other devices of the rows $(X_2)$ and $(X_1)$ are similarly sensed and differential outputs obtained. This mode of sensing eliminates components in the resultant signals which are due to geometrical non-uniformities in the devices of the array and which are referred to as pattern noise.

To enable readout of the next row of devices column line and row line voltages must be reestablished. The establishment of column line voltage is performed by the column line switches (91)–(94) in the form of MOSFET transistors integrally formed on the substrate and each having a source electrode, a drain electrode and a gate electrode. Each of the drains of the devices (91)–(94) is connected to one end of a respective one of the column lines $(Y_1)$–$(Y_4)$ and each of the sources is connected to an output terminal of source (95) which is a high output inpedance amplifier. Each of the gates of the devices (91)–(94) is connected to an output terminal of a column reset gate generator (96) at the output of which appear column reset gate pulses to reestablish storage voltage on the column lines. The amplifier (90) provides a readout of charge transfer between rows and columns.

To readout the next pair of rows of devices, namely rows $(X_3)$ and $(X_2)$, during the next period of scan, readout voltages of $-7.5$ and zero, respectively, are provided to these lines. These voltages are provided by odd-even generator (68) through transistor switches (69a) and (69b) gated by reset gate generator (70). The odd-even generator is driven by X-axis clock pulses to provide an odd output from terminal (1) thereof and an even output from terminal (2) thereof. The reset gate is also driven by X-axis clock pulses. The sources of transistor switches (69a) and (69b) are connected to terminals (65a) and (65b), respectively. The drains of transistor switches (69a) and (69b) are connected to the output of reset gate generator (70).

Prior to readout of the second and third row of devices storage voltage is re-established on all of the row lines. To this end row reset switches (83)–(86) are provided in the form of MOSFET transistors integrally formed on the substrate (21), each having a drain electrode connected to the other end of a respective one of the row conductor lines $(X_1)$–$(X_4)$ and each having a source electrode connected to a bias voltage source (87) in the form of a common row driver amplifier having a high output impedance such that source (87) will not drive current into amplifier (88). Each of the gate electrodes of the transistors (83)–(86) is driven by pulses obtained from the output of a clamp scanner (89) and synchronized with the X-axis clock pulses. The clamp scanner (89) operates in conjunction with row scanner (81) and assures that all rows not being read by scanner (81) are maintained at a proper bias by source (87). The scanner (89) is similarly constructed of suitable shift registers as is scanner (81).

A row reset gate pulse is provided just prior to the drop in voltage of the row select waveform. Thus, all of the row lines are reset and floated with the exception of row lines $(X_2)$ and $(X_3)$ to zero and $-7.5$ volts, respectively, preparatory to the readout of the row $(X_3)$ and injection of the charge of the second row previous readout. The injection of the charge in row $(X_2)$ will occur concurrently with the readout of charge in row $(X_3)$ in the next period of scan.

The column lines $(Y_1)$–$(Y_4)$ are raised to zero volts in sequence to provide readout of the devices of the row. The first device in the first row $(X_3)$ is read out by the rise in potential of the $(Y_1)$ line to zero volts which causes charge stored in the column cell to transfer into the row cell of the first device. The transferred charge is sensed on terminal (65a) connected to line $(X_3)$ through transistor (63). Simultaneously, as the potential on line $(X_2)$ is zero, the charge stored in the first device of the second row is injected into the substrate and a signal is obtained corresponding to an emptied device on terminal (65b). An output is obtained from the amplifier (66) which is the difference of the two signals. At the end of the period of scan of row (3), the voltage at terminal (65a) and hence on row line $(X_3)$ is raised to zero to effect simultaneous injection of charge stored in the devices of row (3).

A plurality of column line drive switches in the form of MOSFET transistors (111)–(114) are provided. Each of the transistors (111)–(114) has a drain electrode connected to one end of a respective one of the column lines $(Y_1)$–$(Y_4)$. The source electrodes of the transistors (111)-(114) are connected to the output of column drive generator (115) which is driven by Y-axis pulses. The gate electrode of each of the transistors (111)-(114) is connected to respective ones of terminals (1)-(4) of column line scanner (116). The voltage waveform produced by generator (115) has a value of −15 volts over a first period and a value of zero volts over a second period. Thus outputs appearing in sequence on the gates of transistors (111)-(114) lower the potential of lines $(Y_1)$-$(Y_4)$ in sequence to −15 volts during the first period and raise the potential of lines $(Y_1)$-$(Y_4)$ in sequence to zero volts during the second period.

To provide the outputs at the terminals (1)-(4) of the column scanner (116), line synchronizing pulses from the output of counter (53) are applied to the input of the column scanner (116) and, in addition, pulses from the A generator (118) and the B generator (119) are applied. The $0_A$ generator (118) applies the even numbered pulses of the clock pulse generator (51) to the column scanner (116) and the B generator (119) applies the odd numbered pulses of the clock pulse generator (51) to the column scanner (116). From the applied input information the column scanner develops the outputs at the output terminals (1)-(4) thereof.

In the operation of the apparatus of FIG. 6, the voltage of the row line source (87), which is indicated as −7.5 volts, establishes the charge storage capability of the row connected cells of each of the devices of the array and the output of column drive generator (115) of −15 volts establishes the charge storage capability of the column connected cells of each of the devices of the array. Under the control of the clock pulse generator (51), frame synchronizing pulses are applied to the row scanner (81). Row line gating pulses are derived at the end at the output terminals (1)-(4) of row scanner (81) in response to row line rate clocking of the row scanner by the X-axis clock pulses. The row line gating pulses are utilized to gate in sequence the row enable switches (61)-(64) to connect in overlapping sequence row lines $(X_1)$ and $(X_3)$ to terminal (65a) and to connect in overlapping sequence row lines $(X_2)$ and $(X_4)$ to terminal (65b), and hence to the differential amplifiers (66) for readout.

The method of operation of the present invention will now be described with reference to the circuit disclosed in FIG. 6. Before starting the detailed description of the method however, the following definitions should be noted. The term VC refers to the collapsed well voltage within a picture element or cell, i.e., the voltage at which a potential well can no longer hold any signal charge. The term VF refers to the full well voltage, i.e., the voltage that is applied to achieve full well capacity to receive a charge. The term VH refers to half of a full well voltage, i.e., the voltage at which a potential well can contain one half the charge that can be stored at full well voltage. In the preceeding discussion, the VC voltage was defined as 0 volts, the VF voltage was defined at −15 volts, and the VH was defined as −7.5 volts.

The X profile of an object within a field of view of the solid state imager shown in FIG. 6 is defined as the summation of charge in a column sequentially read along a row axis, assuming that the X-axis is parallel to the row axis and the Y-axis is parallel to the column axis. Just prior to exposing the imager to an object, all column wells are set to VF voltage and all row wells are set to VH voltage. In order to achieve an X profile read, the data pulses applied to the row scanner (81) and clamp scanner (82) are set to a state such that all of the field effect switches (82)-(86) are gated into conduction such that all of the source terminals are connected to the input terminal of the amplifier (88). In addition, the common gate driver (96) connected to the column switches (91)-(94) for the column lines $(Y_1)$-$(Y_4)$ is gated off. The apparatus for generating gate control pulses to the driver devices (87), (95) and (96) are well known in the art and thus not described. The timing of such pulses will be apparent from the description of operation. To obtain the X-profile points, the column drive generator (115) provides a voltage output at VF level to the FET switches (111) through (114). The column scanner (116) is clocked to connect column Y-1 to the column drive generator (115). The column drive generator (115) output is then switched to VC voltage which forces any charge in all column Y-1 potential wells to move into the respective row potential well. This transfer of charge is sensed by the common row current amplifier (88). The output signal then developed by the amplifier (88) can be sampled and will correspond to the sum of charge in the column Y-1 potential wells. After sampling, the column drive generator (115) is switched to VF voltage the reset all the potential wells in column Y-1. The column scanner (116) is then clocked to provide a gate signal to the FET switch (112) to connect column Y-2 to the column drive generator (115) where the sequence is then repeated to obtain a sample representative of the total charge appearing in column Y-2 potential wells.

At the completion of the scanning of all of the column lines, all of the signal charge is still in the column wells. Thus, the X-profile has been obtained by reading the array in a non-destructive manner.

A Y-profile of an object within the field of view of the imager (10) is obtained in substantially the same way as the X-profile. The Y-profile is defined as stated above as the summation of charge in a row sequentially read along a column axis. To obtain the Y-profile after the X-profile has been read requires that the common row driver (87) be switched to VF voltage, the common column gate driver (96) is enabled to gate the FET switches (91)-(94) into conduction and the common column driver (95) is switched to VH voltage. This forces the signal charge to reside in the row potential wells. During a Y-profile read, the following conditions are established:

the data pulses to the column scanner are interrupted so that all of the FET switches (111)-(114) are maintained in a non-conductive state;

the common column gate driver (96) is maintained in an enabled state so that the FET's (91)-(94) are maintained conducting whereby the FET sources are all connected to the common column current amplifier (90); and the output of the common column driver (95) is at a high impedance so that it does not supply current to the column current amplifier (90).

To obtain the Y-profile points, the row scanner (81) and clamp scanner (80) are loaded with data pulses to begin the scanning operation. Row (X-1) is connected to the odd read line and row (X-2) is connected to the even read line. Row (X-1) and row (X-2) are also disconnected from the common row driver (87) by the clamp scanner. It should be noted here that the operation of the row scanner and clamp scanner during a Y-profile read is substantially the same as would occur for a normal individual picture element readout. The significant difference is provided by the control pulses to the column lines which gate the FET switches (91)–(94) and by the interruption of the column scanner operation to maintain the switches (111)–(114) in an off condition. Continuing with the description of the sequence of operation for obtaining Y-profile points, the odd-even generator 68 (68) the odd read line from VF voltage to VC voltage which forces any charge in all row (X-1) wells to move into the respective column potential wells. This transfer of charge is sensed by common column current amplifier (90). The output of (90) can be sampled and this corresponds to the sum of charge in all the picture elements comprising the row (X-1) potential wells. After sampling, the odd-even generator (68) switches the odd read line to VF voltage to reset all the potential wells in row (X-1). The generator (68) then switches the even read line from VF voltage to VC voltage to force any charge in all of the potential wells in row (X-2) to move into the respective column potential wells. The transfer of charge is again sensed by common column current amplifier (90) whose output can then be sensed to detect the sum of the charge in the row (X-2) wells. After sampling, the even read line is switched back to VF voltage to reset all the row (X-2) potential wells. The row scanner (81) and clamp scanner (80) is then clocked twice so that the (X-3) and (X-4) rows can be read. The sequence of events described above is then repeated for these two rows. At the completion of all of the row scanning, all of the signal charge is still in the row wells. Thus, the Y-profile has also been obtained by reading the array without destruction of data.

The order in which X-profile and Y-profile are read is not critical to the invention. Either may be read first or they may be read in any order as long as the initial conditions described above are maintained. Since the reading of the profile data does not destroy any signal charge located in the matrix array, the array may be subsequently raster scanned as a differential row read imager in the same manner as is disclosed in the aforementioned U.S. Pat. Nos. 4,240,116 and 4,241,421 or by random access or other raster scan techniques suitable for CID read-out. Apparatus and method for processing data from a CID imager are shown and described in U.S. Pat. No. 4,493,105 assigned to General Electric Company. Furthermore, the matrix may be sectioned based upon the results of the profile read-out selected groups of picture elements individually evaluated to obtain a detail representation of an object or portion thereof imaged in a particular area of the matrix.

While the invention has been described in connection with an array of 16 picture elements, it is apparent that the invention is particularly applicable to arrays including devices magnitudes greater in number than 16. As stated previously, it is particularly useful as imager dimensions (number of pixels) become larger. While the invention has been described in a specific embodiment, it will be understood that modifications may be made by those skilled in the art, and it is intended by the appended claims to cover all such modifications and changes as fall within the true spirit and scope of the invention.

I claim:

1. In a solid state imager having a matrix of individual picture elements arranged in rows and columns, each of the picture elements including a first and a second conductive plate, each of the first conductive plates in each row being connected to a common row electrode and each of the second conductive plates in each column being connected to a common column electrode, read out of the signal in any one picture element being effected by charge transfer between the first and the second conductive plates, a method for obtaining a profile of an object within a field of view of the imager comprising the steps of:

A. Selecting a first row for data readout;
   B. setting a bias voltage on all rows other than the selected row to preclude charge transfer in such other rows;
   C. setting a voltage on all column electrodes to create a potential well at each second conductive plate;
   D. changing the bias voltage on the selected row such that charge under each first conductive plate in the selected row is transferred to the potential well created at the corresponding second conductive placte;
   E. summing the charges appearing on the column electrodes resulting from the charge transfer to thereby obtain a signal representative of the profile along the selected row; and
   F. repeating steps A through E for each of the row electrodes whereby a profile is obtained along the axis of the rows.

2. The method of claim 1 and including the additional steps of:

G. Selecting a first column for data readout;
   H. setting a bias voltage on all columns other than the selected column to preclude charge transfer in such other columns;
   I. setting a voltage on all row electrodes to create a potential well at each first conductive plate;
   J. changing the bias voltage on the selected column such that charge under each second conductive plate is transferred to the potential well created at the corresponding first conductive plate;
   K. summing the charges appearing on the row electrodes resulting from the charge transfer into the potential wells created under the first conductive plates to thereby obtain a signal representative of the profile along the selected column; and
   L. repeating steps G through L for each of the column electrodes whereby a profile is obtained along the axis of the columns.

3. In a object recognition system of the type including a solid state imager having a matrix of picture elements arranged in rows and columns, a data processing system connected to the imager, the data processing system including a memory for storing data and further including comparing means for comparing stored data to data received from the imager, a method for identifying objects comprising the steps of:

A. Storing in the memory a profile characteristic along X and Y axes of ideal characteristics of an object of the type to be identified;
   B. imaging an object to be identified on the solid state imager;
   C. reading directly from the imager the summation of all picture elements in each of the rows and of the columns;
   D. generating a profile characteristic of the object to be identified using the summation of picture elements; and
   E. comparing the stored profile characteristics to the generated profile characteristic to identify the object.

4. In a solid state imager having a matrix of individual picture elements arranged in rows and columns, each of the picture elements including a first and a second conductive plate, each of the first conductive plates in each row being connected to a common row electrode and each second conductive plates in each column being connected to a common column electrode, readout of the signal in any one picture element being effective by charge transfer between the first and the second conductive plates, apparatus for obtaining a profile of an object within a field of view of the imager comprising:
- A. means for sequentially selecting a row for data readout;
- B. means for setting a bias voltage on each non-selected row to preclude charge transfer in such non-selected rows;
- C. means for setting a voltage on all common electrodes to create a potential well at each second conductive plate;
- D. means for changing the bias voltage on the selected row such that charge under each first conductive plate is transferred to the potential well created at the corresponding second conductive plate; and
- E. means synchronized with said selecting means for summing the charges appearing on the column electrodes resulting from the charge transfer between said first and second conductive plates to thereby obtain signals representative of the profile along the row axis.

5. The apparatus in claim 4 and including:
- F. means for sequentially selecting a column for data readout;
- G. means for setting a bias voltage on each non-selected column to preclude charge transfer in such non-selected columns;
- H. means for setting a voltage on all row elecrodes to create a potential well at each first conductive plate;
- I. means for changing the bias voltage on the selected column such that charge under each second conductive plate is transferred to the potential well created at the corresponding first conductive plate; and
- J. means synchronized with said column selecting means for summing the charges appearing on the row electrodes resulting from the charge transfer between said second and first conductive plate to thereby obtain signals representative of the profile of the object along the column axis.

6. The apparatus of claim 5 wherein said profile readout is non-destructive and including means for sequentially reading each individual picture element in said array to obtain a composite representation of the object.

7. The apparatus of claim 6 and including means for selecting groups of picture elements for individual readout based upon data obtained during the profile readout.

* * * * *